US007003718B2

(12) United States Patent
Luetkemeyer

(10) Patent No.: US 7,003,718 B2
(45) Date of Patent: Feb. 21, 2006

(54) MEMORY-BASED SHUFFLE-EXCHANGE TRACEBACK FOR GIGABIT ETHERNET TRANSCEIVER

(75) Inventor: Christian Luetkemeyer, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/624,774

(22) Filed: Jul. 22, 2003

(65) Prior Publication Data

US 2004/0054957 A1 Mar. 18, 2004

Related U.S. Application Data

(63) Continuation of application No. 09/652,719, filed on Aug. 31, 2000, now Pat. No. 6,598,205.

(60) Provisional application No. 60/151,679, filed on Aug. 31, 1999.

(51) Int. Cl.
    *H03M 13/41* (2006.01)
(52) U.S. Cl. .................................................. 714/795
(58) Field of Classification Search ................ 714/795; 375/265
    See application file for complete search history.

(56) References Cited

U.S. PATENT DOCUMENTS

| | | | | |
|---|---|---|---|---|
| 4,748,626 A | * | 5/1988 | Wong | 714/746 |
| 4,823,346 A | * | 4/1989 | Kobayashi et al. | 714/794 |
| 5,379,306 A | * | 1/1995 | Noma et al. | 714/792 |
| 5,410,555 A | * | 4/1995 | Itakura et al. | 714/795 |
| 5,457,705 A | * | 10/1995 | Todoroki | 714/795 |
| 5,509,021 A | * | 4/1996 | Todoroki | 714/795 |
| 5,651,032 A | * | 7/1997 | Okita | 375/341 |
| 5,717,706 A | * | 2/1998 | Ikeda | 714/786 |
| 5,841,819 A | * | 11/1998 | Hu et al. | 375/341 |
| 5,946,361 A | * | 8/1999 | Araki et al. | 375/341 |
| 6,205,187 B1 | * | 3/2001 | Westfall | 375/341 |
| 6,289,487 B1 | * | 9/2001 | Hessel et al. | 714/795 |
| 6,598,205 B1 | * | 7/2003 | Luetkemeyer | 714/795 |

* cited by examiner

*Primary Examiner*—Stephen M. Baker
(74) *Attorney, Agent, or Firm*—McAndrews, Held & Malloy

(57) ABSTRACT

A decoder having a memory structure which receives and stores potential symbols, with each of the potential symbols having a unique pointer associated therewith. One of the potential symbols is a most likely symbol. The most likely symbol is selected using a pointer selector which processes the unique pointers according to a predetermined selection operation and selects the most likely pointer which, in turn, is uniquely associated with the most likely symbol. The most likely pointer then is used to produce the most likely symbol. The pointer selector is a shuffle exchange network and the predetermined selection operation is a shuffle-exchange operation. The decoder can be used in systems that conform to IEEE Standard 802.3ab, e.g., gigabit Ethernet systems. The potential symbols are four-dimensional, 12-bit symbols having eight symbol states. The memory structure and pointer selector can be constituent of a maximum likelihood decoder, for example a trellis decoder, more specifically a Viterbi decoder. One such pointer selector is a shuffle exchange network which selects the most likely pointer using a shuffle exchange operation upon the unique pointers and not the potential symbols, as with previous architectures and methods.

7 Claims, 4 Drawing Sheets

MEMORY-BASED SHUFFLE-EXCHANGE TRACEBACK FOR GIGABIT ETHERNET TRANSCEIVER

CROSS-REFERENCE TO RELATED APPLICATION

This patent application is a continuation of U.S. patent application Ser. No. 09/652,719, filed on Aug. 31, 2000, now U.S. Pat. No. 6,598,205, issued on Jul. 22. 2003, which claims the benefit of the filing date of U.S. Provisional Patent Application Ser. No. 60/151,679, filed Aug. 31, 1999, and entitled MEMORY-BASED SHUFFLE-EXCHANGE TRACEBACK FOR GIGABIT EHTERNET, the entire contents of which are hereby expressly incorporated by reference.

BACKGROUND OF THE INVENTION

1. Field of the Invention

The present invention relates to a system and a method for decoding input signal samples in a high-speed communication system. More particularly, the invention relates to a system and a method for decoding the trellis code specified in the IEEE 802.ab standard for Gigabit Ethernet (also termed 1000BASE-T standard).

2. Description of the Related Art

Convolutional encoding and Viterbi decoding are used to provide forward error correction in transmitted digital data, and thus improve digital communication performance over a given noisy channel. The convolutional encoder establishes a code-tree relationship between input and output sequences. Each branch of the tree represents a single input symbol. Any input sequence traces out a specific path through the tree. Another way of viewing the code tree is the trellis diagram.

The Viterbi algorithm attempts to find a path through the trellis using the maximum likelihood decision. The two paths entering each node of a trellis are compared, and the path with the best metric (minimum error) is selected. The other path is rejected since its likelihood can never exceed that of the selected path regardless of the subsequent received data. Thus, at any given time, there is only one path with the best metric entering into each current node of the trellis.

A Viterbi decoder is a maximum likelihood decoder that provides a forward error correction. Viterbi decoding is used in decoding a sequence of encoded symbols, such as a bit stream. The bit stream can represent encoded information in telecommunication transmission through various media with each set of bits representing a symbol instant.

In the decoding process, the Viterbi decoder works back through a sequence of possible bit sequences at each symbol instant to determine which bit sequence has most likely been transmitted. The possible transitions from a bit at one symbol instant, or state, to a bit at a next, subsequent, symbol instant or state is limited. Each possible transition from one state to a next state can be shown graphically and defined as a branch. A sequence of interconnected branches defines a path.

Each state can only transit to a limited number of next states upon receiving a next bit in the bit stream. Thus, some paths survive during the decoding process and other paths do not. By eliminating those transition paths that are not permissible, computational efficiency can be improved in determining those paths most likely to survive. The Viterbi decoder typically defines and calculates a branch metric associated with each branch and employs this branch metric to determine which paths will survive and which paths will not.

A branch metric is calculated at each symbol instant for each possible branch. Each path has an associated metric, an accumulated cost, that is updated at each symbol instant. For each possible transition, the accumulated cost for the next state is obtained by selecting a smaller one of the sums of the branch metrics for different possible transitions and the path metrics at the previous states.

While several paths survive the transition from one symbol instant to a next symbol instant, there is only one minimum accumulated cost path. A sequence of symbol instants tracing back through the trellis that extends a path with the minimum accumulated cost defines the length, or decoding depth D, of a trace-back. The individual state in the trellis associated with the minimum accumulated cost in a trace-back is translated into a most likely data to have been transmitted in that symbol instant. The data is referred to as a decoded symbol.

By using convolutional codes, a large coding gain can be obtained for a large memory or, equivalently, a long constraint length. The complexity of a maximum likelihood decoder is approximately proportional to the number of states, and, using existing design methodologies, can grow exponentially with symbol length and, thus, memory size. This increased size and complexity comes at the cost of substantially increased power requirements, and large device area requirements for high-precision signal processing.

What is needed is a system and a method that makes it possible for a significant reduction in size and complexity of a maximum likelihood decoder which likewise affords substantially reduced power requirements for a given application.

SUMMARY OF THE INVENTION

The present invention meets the aforementioned needs for reducing the size, complexity, and power consumption of decoders, and associated transceivers and communication systems, by providing a memory structure which receives and stores undecoded symbols, with each of the undecoded symbols having a unique pointer associated therewith. One of the undecoded symbols is a most likely symbol. The present invention selects the most likely symbol using a pointer selector which processes the unique pointers according to a predetermined selection operation, for example, a shuffle-exchange operation, and selects the most likely pointer which, in turn, is uniquely associated with the most likely symbol. The most likely pointer then is used to produce the most likely symbol. the decoder outputting the most likely symbol thereby. The present invention can be used in systems that conform to IEEE Standard 802.3ab, e.g., gigabit Ethernet systems.

The memory structure and pointer selector can be constituent of a maximum likelihood decoder, for example a trellis decoder, more specifically a Viterbi decoder. One such pointer selector is a shuffle exchange network which selects the most likely pointer using a shuffle exchange operation upon the pointers and not the potential symbols, as with previous architectures and methods.

In a particular embodiment, the present invention is implemented in a survivor memory unit which includes the memory structure and the shuffle exchange network. The memory structure can be a dual-port RAM FIFO, but also can be a single-port RAM, or even a DRAM, provided the device is capable of a read/modify/write operation within a single clock cycle.

The present invention is contemplated for use in gigabit Ethernet systems, transceivers, and decoders where 4-D symbols are used and the potential symbols are constrained to eight possible symbol states.

Also, the invention herein contemplates a method for symbolic communication, for example, using the IEEE Standard 802.3ab, which includes receiving potential symbols including a most likely symbol, associating each of the received potential symbols with a unique pointer, processing the unique pointers associated with selected ones of the received potential symbols to determine a most likely pointer using a predetermined selection operation; and selecting the most likely symbol using the most likely pointer.

DETAILED DESCRIPTION OF THE EMBODIMENTS

In order to appreciate the advantages of the present invention, it will be beneficial to describe the invention in the context of an exemplary bidirectional communication device, such as a gigabit Ethernet transceiver operating in a Gigabit Ethernet Communication System. The particular exemplary implementation chosen is depicted in FIG. 1, which is a simplified block diagram of a multi-pair communication system operating in conformance with the IEEE 802.3ab standard for one gigabit (Gb/s) Ethernet full-duplex communication over four twisted pairs of Category-5 copper wires.

Figure 1:
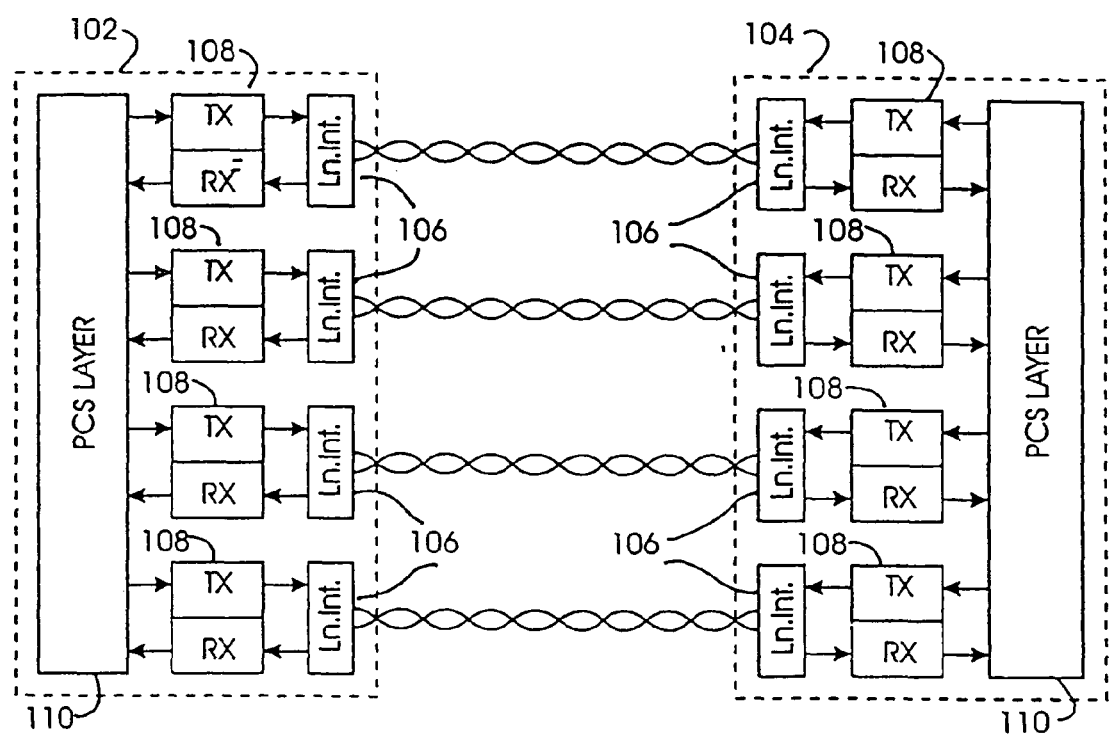
FIG. 1 is a simplified block diagram of a high-speed bidirectional communication system exemplified by two transceivers configured to communicate over multiple twisted-pair wiring channels.

The communication system illustrated in FIG. 1 is represented as a point-to-point system, in order to simplify the explanation, and includes two main transceiver blocks 102, 104, coupled together with four twisted-pair cables. Each of the wire pairs is coupled between the transceiver blocks through a respective one of four line interface circuits 106, and communicate information developed by respective ones of four transmitter/receiver circuits 108, or transceivers, coupled between respective interface circuits and a physical coding sublayer (PCS) subblock 110. Four constituent transceivers 108 are capable of operating simultaneously at 250 megabits per second (Mb/s), and are coupled through respective interface circuits to facilitate full-duplex bidirectional operation. Thus, one Gb/s communication throughput of each of the transceiver blocks 102, 104 is achieved using four constituent transceivers 108 operating at 250 Mb/s (125 megabaud at two-bits per symbol) for each of the transceiver blocks and four twisted pairs of copper cables to connect the two transceivers together.

The exemplary communication system of FIG. 1 has a superficial resemblance to a 100BASE-T4 system, but is configured to operate at 10 times the bit rate. As such, it should be understood that certain system performance characteristics, such as sampling rates and the like, will be consequently higher, causing lengthy and complex operations to be performed during increasingly shorter periods of time. At gigabit data rates over potentially noisy channels, a proportionally greater degree of signal processing is required in many instances to ensure an adequate degree of signal fidelity and quality. Such high-performance communication is realized at the expense of circuit complexity, large device area, and substantial power requirements.

Figure 2:
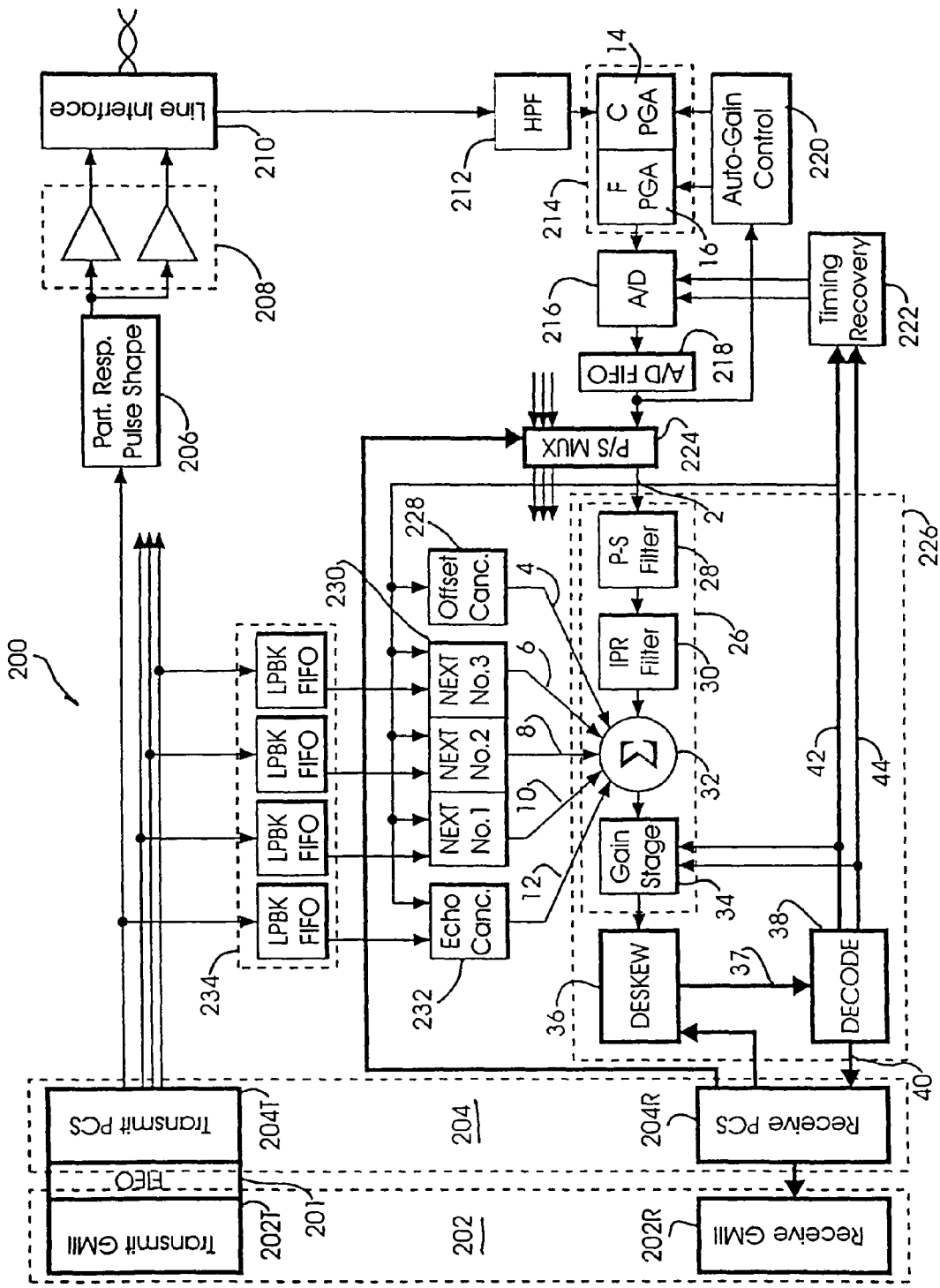
FIG. 2 is a simplified block diagram of a bidirectional transceiver system.

FIG. 2 is a simplified block diagram of an exemplary transceiver block, indicated generally at 200, such as transceiver 102 of FIG. 1. Because the illustrated transceiver application relates to gigabit Ethernet transmission, the transceiver will be referred to as a "gigabit transceiver." For ease of illustration and description, FIG. 2 shows only one of the four 250 Mb/s constituent transceivers, which are operating simultaneously (termed herein four-dimensional, or 4-D, operation). However, because the operation of the four constituent blocks are necessarily interrelated, certain blocks of the signal lines in the exemplary embodiment of FIG. 2 perform 4-D functions and carry 4-D signals. By 4-D, it is meant that the data from the four constituent transceivers are used simultaneously. In order to clarify signal relationships in FIG. 2, thin lines correspond to 1-dimensional functions or signals (i.e., those relating only to a single transceiver), and thick lines correspond to 4-D functions or signals.

Details of operation of a gigabit Ethernet transceiver as found in FIG. 2, not germane to further discussion of the present invention, may be found in U.S. patent application Ser. No. 09/437,719, filed Nov. 9, 1999, which is assigned to the same assignee hereof, and is incorporated by reference in it entirety herein.

Prior to transmission by a remote transceiver, data received at the local transceiver is encoded to reduce the adverse effects of transmission over a noisy channel, for example, using an 8-state 4-D trellis code. Thus, decoder 38 is employed to decode the received symbols from which the original data may be extracted. In the absence of intersymbol interference (ISI) a proper 8-state Viterbi decoder would provide optimal decoding of this encoded data. In the case of gigabit Ethernet, the Category-5 twisted-pair cable introduces a significant amount of ISI, as does the remote transmitter on the other end of the communication channel. Therefore during nominal operation, trellis decoder 38 must decode both the trellis code, and compensate for at least transmission-channel-induced ISI, at a symbol rate of about 125 MHZ.

Figure 3:
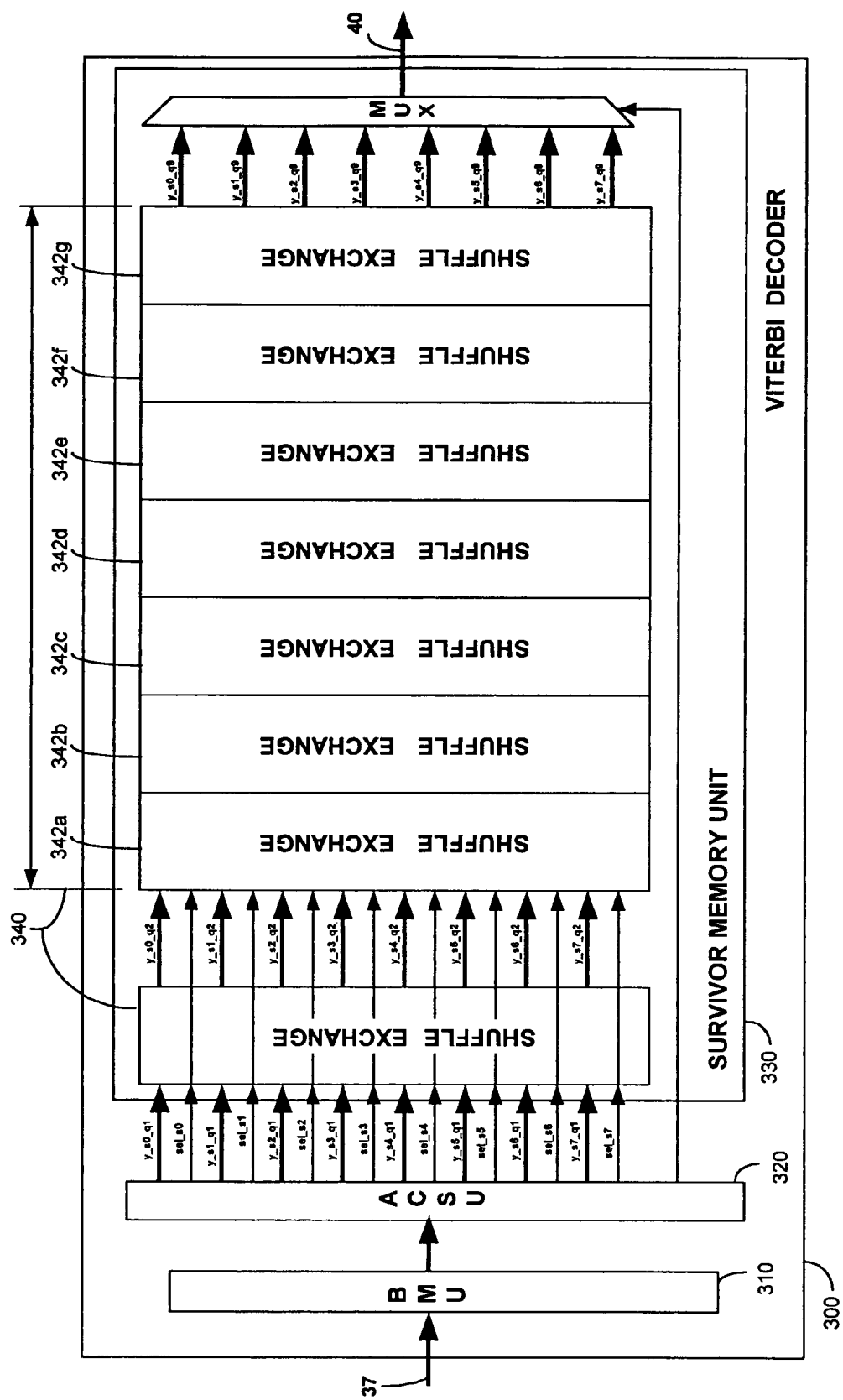
FIG. 3 is a simplified block diagram of a decoder, in which a Survivor Memory Unit (SMU) is illustrated.

The invention in its various embodiments can best be understood by first reviewing the operation of an existing 8-state Viterbi decoder as may be found in trellis decoder 38 (FIG. 2). FIG. 3 is a block diagram of a typical, generalized Viterbi decoder 300 which is used to transform the encoded transmitted data 37 into decoded received data 40. As exemplified herein, decoder 300 can be divided into three blocks.

First, Branch Metric Unit (BMU) 310 receives encoded input data 37 (see FIG. 2), and computes the branch-metrics (transition costs) from one received symbol to the next symbol for all transitions of the trellis of the implemented code. BMU 310 also generates 4-D symbols 320, which correspond to the branch-metrics for all possible transitions.

Second, Add-Compare-Select Unit (ACS) 320 adds the branch-metrics 320 from BMU 310 to the path-metrics for all possible states. The path-metrics correspond to the likelihood of the received symbol sequence to end in the state associated with the path-metrics. In this example, ACS 320 processes 8 states; and each state can be reached by four states from the previous cycle. The output of ACS 320 can be two-bits for each state, which bits indicate the most likely path into this state. ACS 320 also selects the 4-D symbol that corresponds to the most likely input branch, and, therefore, the most-likely symbol.

Third, Survivor Memory Unit (SMU) 330, which receives and merges the eight 4-D output symbols from ACS 320 with a Shuffle-Exchange Network (SEN) 340, which is typically composed of multiple stages. SEN 340 uses a predetermined shuffle-exchange algorithm, which ensures a minimum latency for the selection of the most likely 4-D symbol sequence. Each stage 342a–g of SEN 340 includes 4:1 multiplexors and registers that are configured to process the ninety-six bits which constitute the eight twelve-bit, 4-D symbol input. The multiplexors are controlled by the decisions from the ACS, as represented by eight two-bit selector values (sel_s0 through sel_s7).

While the 4-D symbols (y_S0_q1 through y_s7_q1) propagate through SEN 340, they are selected according to the decisions made in ACS 320 unit. At the end of SEN 340, after for example 9 stages, the most likely 4-D symbol 40 is obtained, corresponding to the input symbols 9 symbol periods ago. The disadvantages with this shuffle-exchange scheme are the high area complexity (about 80% of the flip-flops in Viterbi decoder 3090 are in SEN 340), and the high power dissipation which is due to the moving symbol data.

In view of the foregoing description of existing decoders implemented with a traditional SMU and SEN architectures, the advantages of the present invention as discussed hereafter will be better understood.

Figure 4:
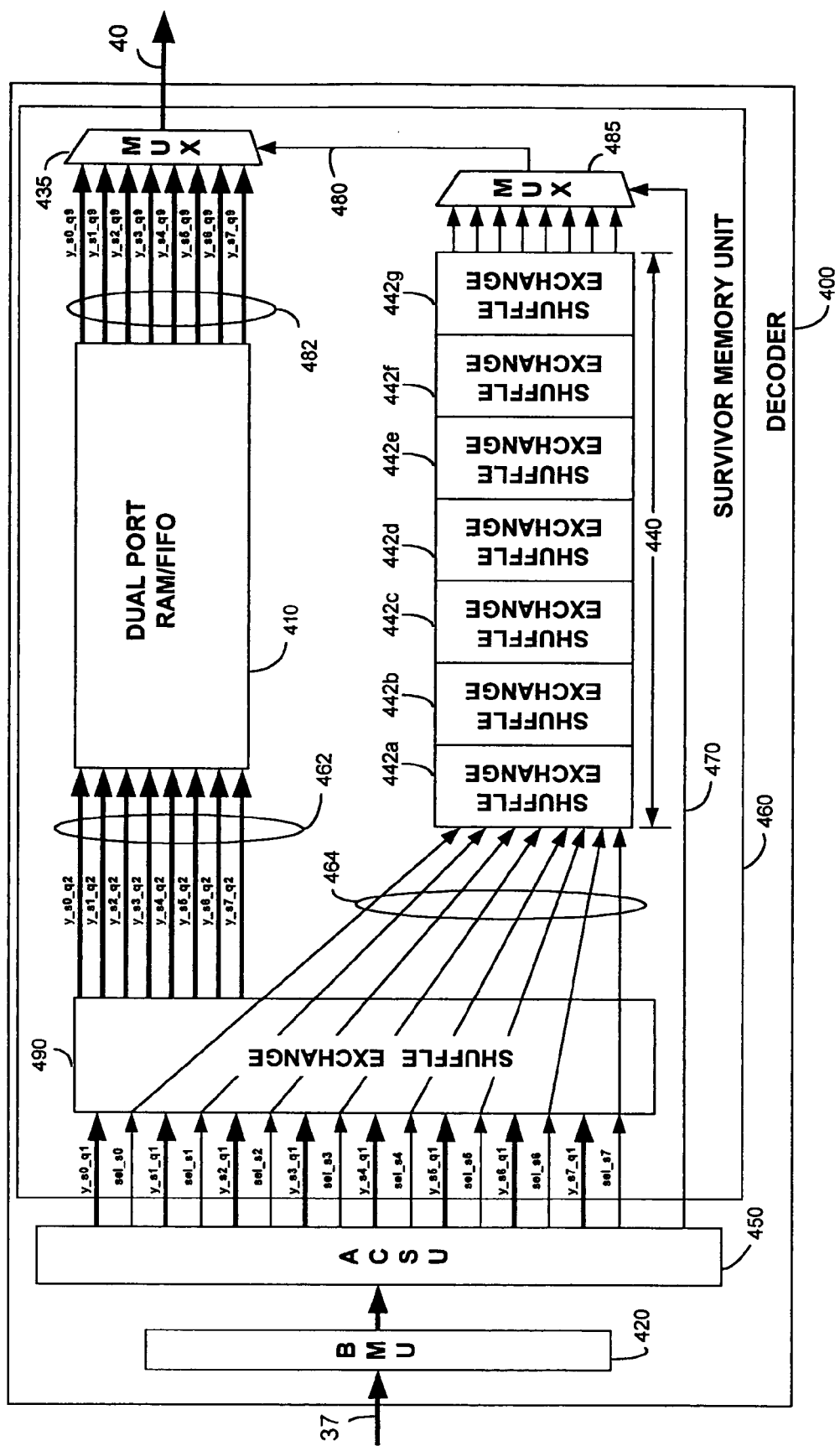
FIG. 4 is a block diagram of a decoder implementing an improved SMU according to the present invention.

In FIG. 4, decoder 400 having an improved SMU 460 according to the present invention is illustrated. In the example used herein, and similar to decoder 300 in FIG. 3, decoder 400 employs eight states, although a decoder implementing a greater, or lesser, number of states could readily be devised by one of ordinary skill in the art. Data flow of inputs 37 into decoder 400 can be similar to inputs 37, shown in FIG. 3. That is, inputs 37 are received by BMU 420 which generates 4-D symbols, corresponding to the branch-metrics for all possible transitions.

Also similar to FIG. 3, Add-Compare-Select Unit (ACS) 450 receives the branch-metrics from BMU 420 and adds them to the path-metrics for all possible states. In this example, ACS 450 processes 8 states; and each state can be reached by four states from the previous cycle. The output of ACS 450 can be two-bits for each state, which bits indicate the most likely path into this state. ACS 450 also selects the 4-D symbol that corresponds to the most likely input branch, and, therefore, the most-likely symbol using select signal 470. Again, similar to existing architectures, ACS 450 directs its output to SMU 460.

SMU 460 essentially includes index-based SEN 440, memory structure 410 which stores the potential symbols during the shuffle-exchange operation, and a DPRAM selector MUX 435, activated by index-based SEN 440, which MUX 435 selects the final, most likely symbol 40 from memory structure 410 using a final, most likely pointer 480, or index, unique to the desired final, most likely symbol 40. Within SMU 460, the shuffle-exchange operation on the twelve-bit, 4-D symbols 462 is replaced by a shuffle-exchange operation to three-bit indexes 464, or pointers, to potential symbols 462. That is, the shuffle-exchange operation is performed upon indexes 464 to the 4-D symbols, rather than upon potential symbols 462 themselves. The most likely symbol 40 is selected, using a look-up step at the end of the shuffle-exchange operation to fetch the 4-D symbol 482 that corresponds to the surviving index 480.

The 4-D symbols 462 are preferably stored in a RAM-based, first-in-first-out (FIFO) memory structure 410. It is preferred to read and write from the memory structure 410 in one clock cycle, therefore it is desirable to use a dual-port memory structure, although other multiport memory structures may be used. Using the DPRAM approach, a desired read address is available for an entire clock cycle which, in turn, makes the data stored at those addresses available for the entire clock cycle. Similarly, the DPRAM architecture illustrated in structure 410 provides a desired write address at the beginning of the same clock cycle, permitting the write address to accept data for substantially all of the clock cycle.

Also, a single-port RAM (SPRAM) employing a read/modified/write scheme may be used for structure 410, provided the memory structure allows data to be properly stored and read during a single clock cycle. It is desirable that the SPRAM allow data to be read during the first half of a clock cycle, after which the data is latched at a memory structure output, with the MUX selecting the most likely symbol. In the second half of the clock cycle, it is preferred that new, incoming potential symbols are stored into respective memory locations of the SPRAM. Furthermore, a dynamic RAM (DRAM) structure observing the above timing parameters also could be used as structure 410, resulting in about one-third as many transistors being used relative the above DPRAM implementation, which may have as many as eight transistors per cell.

In a typical implementation of a Shuffle-Exchange Network, entire symbols are transferred from one stage to the next stage, resulting in a substantial amount of power-consuming switching. Using the memory-based approach indicated in FIG. 4, the pointer, and not the symbols, are switched in SEN 440. The pointer indexes a particular data word representative of the potential symbol, in memory. Potential symbols stay fixed in predetermined memory locations within the FIFO 410, relative to the pointers, which pointers are manipulated to determine the selected data. Because fewer nodes need to be charged/discharged using the pointer based approach, power dissipation is reduced. In FIG. 4, eight 4-D, twelve-bit symbols 462 are admitted to, and stored within, FIFO 410. Because it is known which symbol corresponds with which pointer, proper, final symbol 40 can be selected once the proper pointer 480 is chosen. As shown in FIG. 4, the exemplary eight-state index 464 is enumerated from 0 to 7. Each index (SEL_S0 to SEL_S7) is three-bits in length, which is one-fourth of the number of bits required by the traditional Shuffle-Exchange scheme as shown in FIG. 3. Therefore, power consumption is also reduced by about one-fourth.

It is preferred that each of the shuffle-exchange stages 442a–g include one-of-four multiplexors coupled with a register, as can be found in standard designs well known in the art. Both the MUX and register designs, the implementations for the shuffle-exchange stages 442a–g, as well as for the DPRAM/FIFO 410, can employ techniques and architectures known to those of ordinary skill in the art. The design of FIG. 4 requires less area despite having both DPRAM/FIFO 410 and three-bit index SEN 440, because the memory cells involved with the DPRAM/FIFO 410 tend to be smaller than those based on registers, and, more importantly, because there are fewer one-of-four MUXes used in the implementation of SEN 440.

SMU 460 through-put capabilities are increased, because as the area required for the SEN 440 decreases, the communication lines therein tend to be shorter, realizing an increase in device speed. However, there is an additional delay associated with the read-out of the final most likely symbol from the DPRAM because the DPRAM MUX 435, which is preferred to be a one-of-eight MUX selects the final, most-likely symbol 40 as indicated by the final, most-likely pointer 480, which pointer 480 was selected by ACS 450 after the operation of the memory-based SMU 460.

In a gigabit Ethernet transceiver, it is desirable to cancel echos. In order to cancel the echo that may be present in the potential symbols, particularly in the most likely symbol, it is desirable to first perform a shuffle-exchange operation on the incoming set of potential symbols entering SMU 460, thereby yielding a set of most likely symbols after one clock cycle. This serves as a refinement of the potential symbols prior to processing by the index-based scheme. The output of the shuffle-exchange preprocessor 490 provides selector signals 464 which serve as inputs for the index-based shuffle-exchange, and which is synchronized with subsequent clock cycles. However, if it is unnecessary to provide an improved data sample after a one clock cycle, shuffle-exchange preprocessor 490 may be eliminated from the design. It should be noted that the symbol that has the largest path-metric at the output of shuffle-exchange preprocessor 490 is more likely to be the final, most likely symbol 40 than other potential symbols.

Each stage 462a–462g of SEN 440 requires one clock cycle to operate, because each clock cycle corresponds to a symbol period of the receiver. In the example shown in FIG. 4, there are eight stages in SEN 440, thereby consuming eight clock cycles. Incoming potential symbols 462 enter the DPRAM 410 synchronously with the corresponding pointers 464 entering SEN 440. After one clock cycle, the most likely index 480 is available at SEN MUX 485, which is activated by ACS 450. Most likely index 480, on a subsequent clock cycle, is used to select the final, most likely symbol 40. Therefore, in SMU 460, the eight 4-D, twelve-bit potential symbols 462 are processed synchronously with the corresponding three-bit pointers 464 from input through selection of the final, most likely symbol 40 in about ten clock cycles.

The usefulness of the scheme becomes more apparent as the bit-size of the potential symbols increase relative to the bit-size of the associated pointers. In the example presented herein, the bit-size of the potential symbols is twelve-bits, whereas the size of the pointers is three-bits. Where the bit-width of the potential symbol is even greater, for example, sixteen-to-twenty-four-bits the advantages of the technique and architecture of the present invention become more apparent. The present invention, as exemplified by the improvements in SMU 460 in FIG. 4 is suitable for use in a bidirectional transceiver system, similar to the transceiver system illustrated in FIG. 2. Furthermore, it is desirable to implement the invention herein within the context of a high-speed bidirectional communication, e.g., a gigabit Ethernet communication system, as is illustrated in FIG. 1.

Although the present invention is described in terms of a Viterbi decoder, other decoders or devices employing shuffle-exchange-like operations can benefit from applying the teachings herein. However, one skilled in the art would recognize that these limitations are artifacts of exemplifications of the embodiments of the present invention, and that the applicability of the invention herein is not limited to gigabit Ethernet transceivers, to Viterbi decoders, and so forth.

Many alterations and modifications may be made by those having ordinary skill in the art without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A communication system, comprising:
   a. a memory structure receiving and storing undecoded symbols, each of the undecoded symbols having a unique pointer associated therewith and one of the undecoded symbols being a most likely symbol; and
   b. a pointer selector processing the unique pointers according to a predetermined selection operation and selecting a most likely pointer uniquely associated with the most likely symbol, the decoder outputting the most likely symbol thereby.

2. The communication system of claim 1, wherein the undecoded symbols are representative of potential received signals.

3. A decoder, comprising:
   a. a memory structure receiving and storing undecoded symbols, each of the undecoded symbols having a unique pointer associated therewith and one of the undecoded symbols being a most likely symbol; and
   b. a pointer selector processing the unique pointers according to a predetermined selection operation and selecting a most likely pointer uniquely associated with the most likely symbol, the decoder outputting the most likely symbol thereby.

4. The decoder of claim 3, wherein the undecoded symbols are representative of potential received signals.

5. A method for processing symbolic communication signals, comprising:
   a. receiving potential symbols including a most likely symbol;
   b. associating each of the received potential symbols with a unique pointer;
   c. processing the unique pointers associated with selected ones of the received potential symbols to determine a most likely pointer using a predetermined selection operation; and
   d. selecting the most likely symbol using the most likely pointer.

6. The method of claim 5, further comprising storing the potential symbols in a memory structure.

7. The method of claim 6, wherein the memory structure is capable of performing a read operation and a write operation in one clock cycle.

* * * * *